US007009894B2

(12) United States Patent
Mukker et al.

(10) Patent No.: US 7,009,894 B2
(45) Date of Patent: Mar. 7, 2006

(54) DYNAMICALLY ACTIVATED MEMORY CONTROLLER DATA TERMINATION

(75) Inventors: Anoop Mukker, Folsom, CA (US); Zohar Bogin, Folsom, CA (US); Dave Freker, Sacramento, CA (US); Navneet Dour, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/784,047

(22) Filed: Feb. 19, 2004

(65) Prior Publication Data

US 2005/0185480 A1    Aug. 25, 2005

(51) Int. Cl.
G11C 7/00    (2006.01)
(52) U.S. Cl. .................... 365/191; 365/185.05; 365/63
(58) Field of Classification Search ................ 365/198, 365/189.04, 191, 189.03, 189.05, 189.01, 365/193, 185.05, 63, 51, 225.7, 163, 185.18
See application file for complete search history.

(56) References Cited

U.S. PATENT DOCUMENTS

| | | | | |
|---|---|---|---|---|
| 4,400,801 | A | * | 8/1983 | Kible .................... 365/189.08 |
| 4,584,492 | A | | 4/1986 | Sharp |
| 4,975,598 | A | | 12/1990 | Borkar |
| 5,528,166 | A | | 6/1996 | Iikbahar |
| 5,530,383 | A | * | 6/1996 | May ............................ 327/39 |
| 5,546,016 | A | | 8/1996 | Allen |
| 5,760,657 | A | | 6/1998 | Johnson |
| 5,781,802 | A | * | 7/1998 | Cassetti ........................ 710/57 |
| 5,818,794 | A | * | 10/1998 | Bonella et al. ............. 365/236 |
| 5,869,983 | A | | 2/1999 | Ilkbahar et al. |
| 5,898,321 | A | | 4/1999 | Ilkbahar et al. |
| 5,926,049 | A | | 7/1999 | Shi |
| 6,025,792 | A | | 2/2000 | Smith |
| 6,031,385 | A | | 2/2000 | Ilkbahar |
| 6,072,342 | A | | 6/2000 | Haider et al. |
| 6,075,379 | A | | 6/2000 | Haider et al. |
| 6,084,426 | A | | 7/2000 | Allen |
| 6,127,840 | A | | 10/2000 | Coteus et al. |
| 6,144,218 | A | | 11/2000 | Smith et al. |
| 6,150,862 | A | | 11/2000 | Vikinski |
| 6,166,563 | A | | 12/2000 | Volk et al. |
| 6,172,546 | B1 | | 1/2001 | Liu et al. |
| 6,175,928 | B1 | | 1/2001 | Liu et al. |
| 6,184,737 | B1 | | 2/2001 | Taguchi |
| 6,185,150 | B1 | * | 2/2001 | Toda et al. .................. 365/233 |
| 6,198,307 | B1 | | 3/2001 | Garlepp et al. |
| 6,265,893 | B1 | | 7/2001 | Bates |
| 6,288,563 | B1 | | 9/2001 | Muljono et al. |
| 6,289,447 | B1 | | 9/2001 | Ilkbahar |
| 6,298,450 | B1 | | 10/2001 | Liu et al. |

(Continued)

OTHER PUBLICATIONS

Present Application 10/784,047, starting on p. 2 paragraph [0002] and ending on p. 8, Paragraph [0016].

Primary Examiner—Anh Phung
Assistant Examiner—Dang T. Nguyen
(74) Attorney, Agent, or Firm—Blakely, Sokoloff, Taylor & Zafman LLP (57) ABSTRACT

A method is described that involves, for a first read of information from a memory, activating termination loads on a memory controller's side of a data bus between a memory controller and a memory. The method also involves, for a write of information into the memory, deactivating the termination loads. The method also involves, for a second read of information from the memory, activating the termination loads.

39 Claims, 6 Drawing Sheets

U.S. PATENT DOCUMENTS

| | | |
|---|---|---|
| 6,300,798 B1 | 10/2001 | Possley |
| 6,323,647 B1 | 11/2001 | Anderson et al. |
| 6,323,674 B1 | 11/2001 | Shrivastava et al. |
| 6,347,850 B1 | 2/2002 | Volk |
| 6,351,136 B1 | 2/2002 | Jones et al. |
| 6,353,549 B1 * | 3/2002 | Merritt .................. 365/51 |
| 6,366,129 B1 | 4/2002 | Douglas, III et al. |
| 6,366,867 B1 | 4/2002 | Sine et al. |
| 6,378,010 B1 | 4/2002 | Burks |
| 6,380,758 B1 | 4/2002 | Hsu et al. |
| 6,396,305 B1 | 5/2002 | Carlson |
| 6,445,316 B1 | 9/2002 | Hsu et al. |
| 6,456,016 B1 | 9/2002 | Sundahl et al. |
| 6,459,737 B1 | 10/2002 | Jiang |
| 6,480,438 B1 | 11/2002 | Park |
| 6,509,780 B1 | 1/2003 | Lim et al. |
| 6,525,683 B1 | 2/2003 | Gu |
| 6,538,951 B1 * | 3/2003 | Janzen et al. ......... 365/230.03 |
| 2002/0083255 A1 * | 6/2002 | Greeff et al. ................ 710/305 |

* cited by examiner

DYNAMICALLY ACTIVATED MEMORY CONTROLLER DATA TERMINATION

FIELD OF INVENTION

The field of invention relates generally to electronics; and, more specifically, to dynamically activated memory controller data termination.

BACKGROUND

Figure 1:
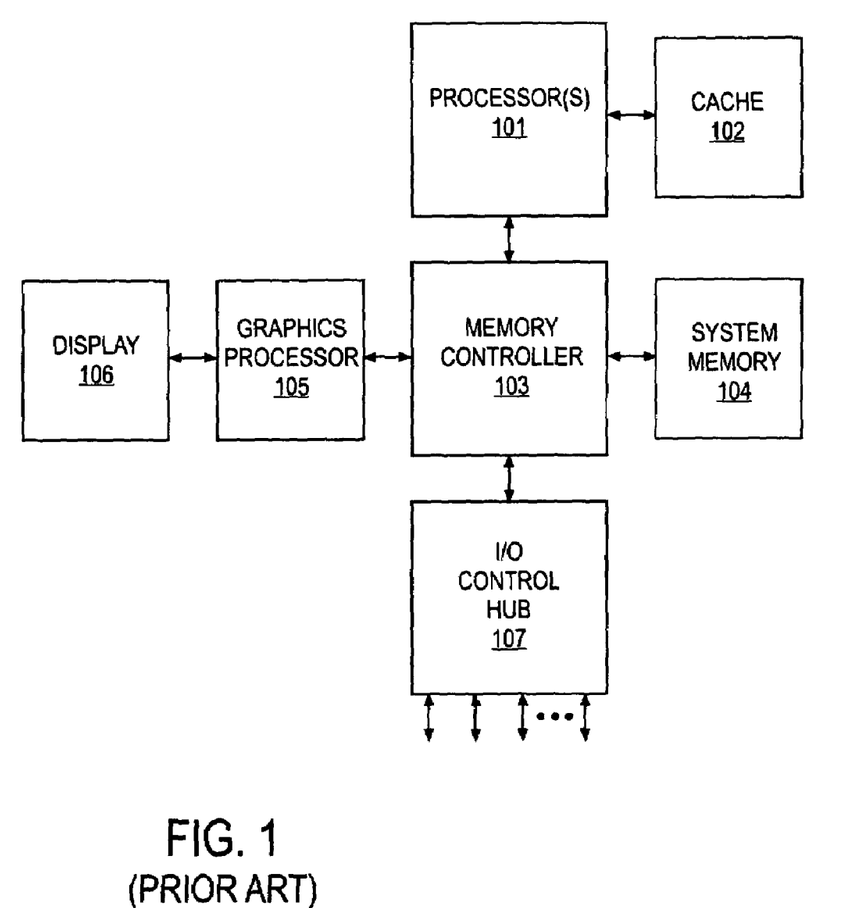
FIG. 1 shows an embodiment of a computing system.

FIG. 1 shows an embodiment of a computing system. The exemplary computing system of FIG. 1 includes: 1) one or more processors 101; 2) a cache 102; 3) a memory controller (or memory control hub (MCH)) 103; 4) a system memory 104 (of which different types exist such as DDR, RDRAM, SDRAM, EDO RAM, etc,); 5) a graphics processor 106; 6) a display/screen 106 (of which different types exist such as Cathode Ray Tube (CRT), TFT, LCD, etc.); and, 7) an I/O control hub (ICH) 107.

The one or more processors 101 execute instructions in order to perform whatever software routines the computing system implements. The instructions frequently involve some sort of operation performed upon data. Both data and instructions are stored in system memory 104 and cache 102. Cache 102 is typically designed to have shorter latency times than system memory 104. For example, cache 102 might be integrated onto the same silicon chip(s) as the processor(s) and/or constructed with faster SRAM cells whilst system memory 104 might be constructed with slower DRAM cells.

By tending to store more frequently used instructions and data in the cache 102 as opposed to the system memory 104, the overall performance efficiency of the computing system improves. System memory 104 is deliberately made available to other components within the computing system. For example, the data received from various interfaces to the computing system (e.g., keyboard and mouse, printer port, LAN port, modem port, etc.) or retrieved from an internal storage element of the computing system (e.g., hard disk drive) are often temporarily queued into system memory 104 prior to their being operated upon by the one or more processor(s) 101 in the implementation of a software program.

Similarly, data that a software program determines should be sent from the computing system to an outside entity through one of the computing system interfaces, or stored into an internal storage element, is often temporarily queued in system memory 104 prior to its being transmitted or stored. The ICH 107 is responsible for ensuring that such data is properly passed between the system memory 104 and its appropriate corresponding computing system interface (and internal storage device if the computing system is so designed). The memory controller 103 is responsible for managing the various contending requests for system memory 104 access amongst the processor(s) 101, interfaces and internal storage elements that may proximately arise in time with respect to one another.

Another computing system component that the memory controller 103 may have to deal with (because it requests access to the system memory 104) is the graphics processor 105. The graphics processor 105 can be viewed as a co-processor that "takes on" the responsibility of performing sophisticated instructions associated with the presentation of complex visual images on the computing system's display 106. By removing such responsibility from processor(s) 101, the performance efficiency of the processor(s) is improved.

The graphics processor 105 is designed to execute display image specific instructions so that display image specific software routines can be executed.

Figure 2:
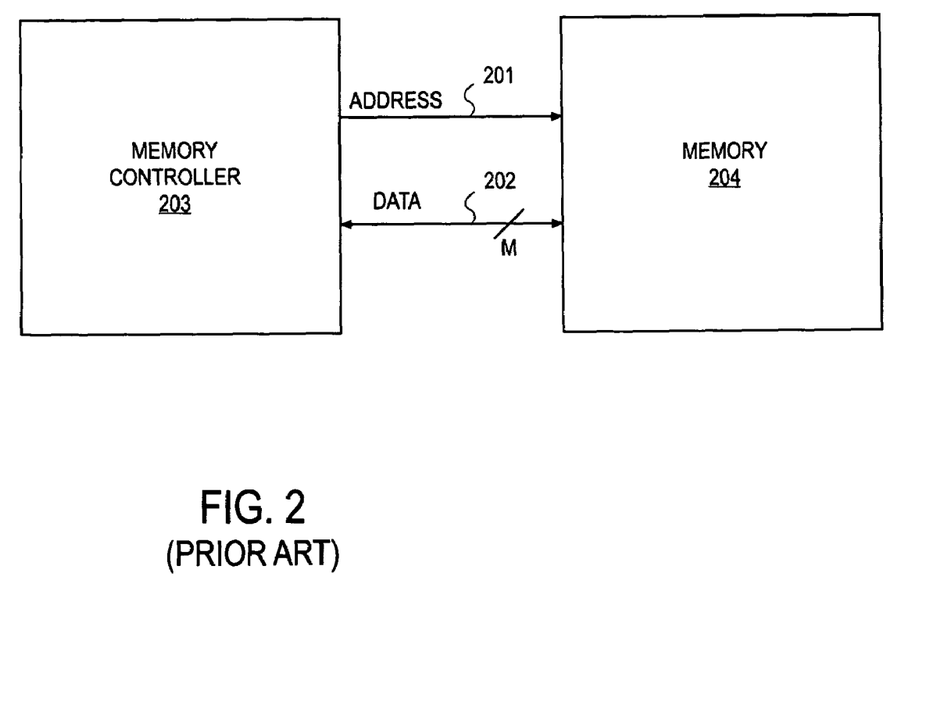
FIG. 2 shows a more detailed depiction of an interface between a memory controller and a memory.

FIG. 2 shows a more detailed depiction of an interface between a memory controller 203 and a memory 204. As observed in FIG. 2, the interface between the memory controller 203 and the memory 204 includes an address bus 201 and a data bus 202. The memory 204 can be viewed as having two basic functions: read and write. During a write cycle information (e.g., data, instructions, etc.) is written into specific locations of memory 204. During a read cycle information is read from specific locations memory 204.

The address bus 201 is driven by the memory controller and can be viewed as the wiring where the specific memory locations mentioned above are identified for both write cycles and read cycles. The data bus 202 is the wiring that transports the information written to memory 204 during a write cycle and read from memory 204 during a read cycle. Note that the data bus is "bi-directional" in that the information written into memory 204 during a write cycle is driven across the data bus 202 by the memory controller 203 to the memory 204; while, by contrast, the information read from memory 204 during a read cycle is driven across the data bus 202 by the memory 204.

Memory 204 typically has an associated "data width" of M bits which corresponds to the amount of information (in bits) that can be written to or read from a specific location (referred to as an "address") that is identified by the memory controller 203 on address bus 201. As such, the data bus 202 is likewise implemented as a bus of width M.

DISCUSSION OF PERTINENT PRIOR ART

A problem with high speed memory controller/memory interfaces is the presence of signaling "reflections". Signaling reflections are a consequence of a "mismatch" between the characteristic impedance of a wiring trace that carries a high speed signal (such as a wire that carries a bit in the M wide data bus 202 of FIG. 2) and the impedance of a load that is placed at or near a terminating end of the wiring trace. If the load impedance of a wiring trace matches the characteristic impedance of the wiring trace; then, no reflections should exist on the wiring trace.

However, if there is a mismatch between the characteristic impedance of a wiring trace and its load impedance then reflections are apt to appear on the wiring trace. A reflection is reflected signal energy and can cause signaling integrity problems on a wiring trace. For example, referring to FIG. 2, consider a pulse of data to be written into memory 204 that travels along data bus 202 in a direction from memory controller 203 to memory 204. Upon reaching a termination load at the memory 204, should a reflection arise as a consequence of an impedance mismatch, the pulse will "bounce-back" along data bus 202 in a direction from memory 204 to memory controller 203.

If an impedance mismatch also exists at the memory controller 203 side of the data bus 202, the reflected pulse will bounce-back again so as to re-travel from the memory controller 203 back to the memory 204. The reflecting process may then repeat such that the reflected pulse bounces back and forth multiple times between the memory controller 203 and the memory 204. Reflected signal energy diminishes with each bounce-back—so eventually the continuously reflected pulse will disappear. However, over the course of its existence, the reflected pulses can interfere with a subsequent pulse that is placed onto the same wiring trace; which, in turn, can corrupt the interpretation of the subsequent pulse by the device that it was sent to (i.e., the memory controller 203 in the case of a read, the memory 204 in the case of a write).

In order to diminish data corruption problems caused by reflections, the wiring traces associated with the data bus 202 may be terminated with termination loads that are designed (ideally) to match the characteristic impedance of the wiring traces (or, are at least posses an impedance that is "close" enough to the wiring traces' characteristic impedance so as to produce negligible reflected signal energy). Because the data bus is bi-directional 202, note that termination impedances may be placed on either or both sides of the data bus.

Specifically, for purposes of diminishing or eradicating reflected signal energy that may arise from a memory write, termination loads may be placed at or near the terminating ends of the wiring traces on the memory 204 side of the data bus 202 for each bit in the data bus. Likewise, for purposes of diminishing or eradicating reflected signal energy that may arise from a memory read, termination loads may be placed at or near the terminating ends of the wiring traces on the memory controller 203 side of the data bus 202 for each bit in the data bus.

To date, however, only static termination loads that continuously impose their effect on the data bus are known. In the case of such static termination loads, assuming that the termination loads are successfully designed so as to eradicate or sufficiently diminish reflected signal energy, the presence of the "unused" terminating loads for a memory read or memory write may adversely affect the performance of the memory controller/memory system. That is, the presence of "memory-side" termination loads during a memory read can diminish the performance of a memory read (noting that the "memory controller side" termination loads should eradicate/diminish reflections during a memory read because the information read from memory 204 travels from memory 204 to memory controller 203); and, the presence of "memory controller-side" termination loads during a memory write can diminish the performance of a memory write (noting that the "memory side" termination loads should eradicate/diminish reflections during a memory write because the information written into memory 204 travels in a direction from memory controller 203 to memory 204).

The diminished performance is a consequence of the higher capacitance and/or higher resistance that is added to the data bus's wiring traces by the unnecessary loading for the particular memory function (i.e., read or write). The presence of higher capacitance and/or higher resistance results in slower signaling in the form of longer rise/fall times which can adversely affect timing margins across the memory controller/memory interface.

FIGURES

The various embodiments of the present invention are illustrated by way of example, and not by way of limitation, in the figures of the accompanying drawings and in which.

DETAILED DESCRIPTION

Figure 3:
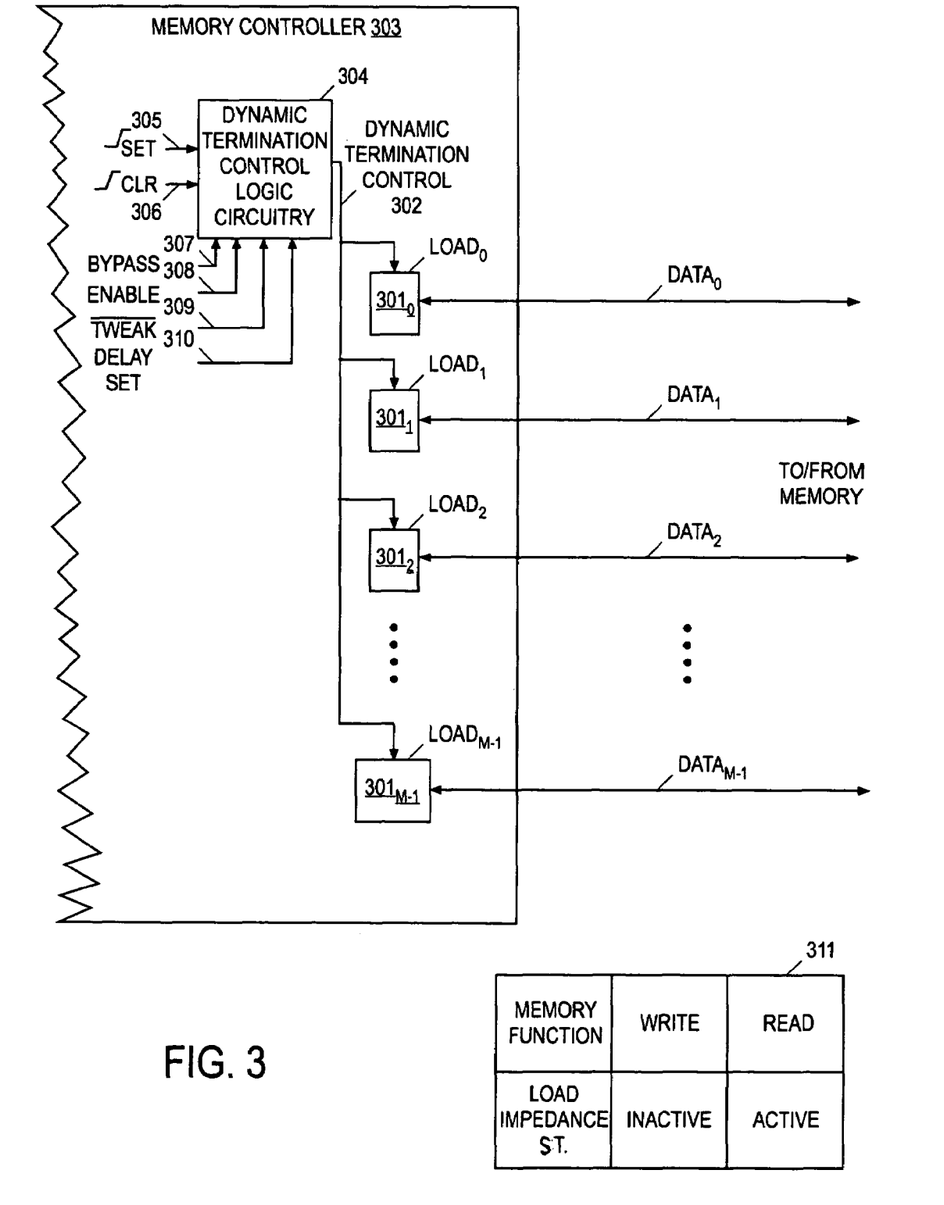
FIG. 3 shows a depiction of an improved memory controller having dynamically activated data termination.

FIG. 3 shows a depiction of an improved memory controller 303 having dynamically activated data termination. The memory controller 303 includes termination loads $301_0$ through $301_{M-1}$ for the wiring $DATA_0$ through $DATA_{M-1}$ associated with each of the M data bus lines of which an M wide data bus that the memory controller 303 couples to a memory with is composed. For ease of drawing only the terminating termination loads $301_0$ through $301_{M-1}$ are shown coupled to the data bus wiring $DATA_0$ through $DATA_{M-1}$. That is no circuitry is shown that accepts information from the data bus that has been read from memory; and, no circuitry is shown that presents information onto the data bus that is to be written into memory.

Each of termination loads $301_0$ through $301_{M-1}$ is capable of being set "active" (in which case the terminating termination load is coupled to its corresponding data bus wiring so as to squelch reflection of signals thereon) or "inactive" (in which case the terminating termination load is not coupled to its corresponding data bus wiring so to have no significant influence on the reflected energy of signals thereon). A more detailed embodiment of such a termination load is discussed in more detail further below with respect to FIG. 6. In various embodiments each of the termination loads $301_0$ through $301_{M-1}$ are placed at or near a terminating end of its corresponding data bus wiring and therefore may also be referred to as "terminating load impedances", "termination" and the like.

Dynamic termination control logic circuitry 304 is used to control whether the termination loads $301_0$ through $301_{M-1}$ are placed into an "active" or "inactive" state. A high level depiction of the basic operation 311 of the dynamic termination control logic circuitry 304 is shown in FIG. 3. Here, it is observed that the dynamic termination control logic circuitry 304 sets the termination loads $301_0$ through $301_{M-1}$ "inactive" if the memory controller 303 is performing a memory write or "active" if the memory controller 303 is performing a memory read. This operation 311 is consistent with the perspective provided above that during a memory write the "memory controller side" termination loads $301_0$ through $301_{M-1}$ are unnecessary and can have a detrimental effect on performance; and, during a memory read the "memory controller side" termination loads $301_0$ through $301_{M-1}$ Are useful in suppressing reflected signal energy on the data bus.

The dynamic termination control logic circuitry 304 has a dynamic termination control output 302 coupled to each of the memory controller's data bus termination loads $301_0$ through $301_{M-1}$. The dynamic termination control output 302 is used to set the termination loads $301_0$ through $301_{M-1}$ in the "active" or "inactive" state depending on whether the memory controller is reading or writing information from/to memory, respectively. FIG. 3 also shows a particular embodiment of the dynamic termination control logic circuitry having a particular set of inputs 305 through 309.

According to the particular set of inputs observed in FIG. 3, a rising edge at the set input 305 signifies that the memory controller 303 is entering a memory read phase; and, a rising edge at the clear input 306 signifies that the memory controller is leaving the memory read phase. Thus, if a rising edge appears at the set input 305, the dynamic termination control logic circuitry 304 places the termination loads $301_0$ through $301_{M-1}$ into an active state. Once the termination loads $301_0$ through $301_{M-1}$ are set into the active state, the dynamic termination control logic circuitry 304 keeps the termination loads $301_0$ through $301_{M-1}$ in the active state until a rising edge is observed at a clear input 306.

The dynamic control logic circuitry also includes additional inputs 307, 308, 309, 310 that can be used to enhance the dynamic termination load function, assist developers and/or permit the logic circuitry to be compatible within various applications. The bypass input 308 allows for ad hoc activation of the termination loads $301_0$ through $301_{M-1}$. That is, if the bypass input 307 is activated, output 402 activates the termination loads $301_0$ through $301_{M-1}$ irrespective of the other inputs. The enable input 307, when activated, allows the dynamic termination control logic circuitry 304 to modulate the state of the dynamic termination control output 302 in response to the set and clear inputs 305, 306 (provided the bypass input 307 is not activated). The tweak/ input 309 corresponds to a second modulation source of output 402 when both the bypass and enable inputs 307, 308 are deactivated. That is, if both the bypass and enable inputs 307, 308 are deactivated: 1) a first logic state (e.g., a logic high) at tweak/ input 309 deactivates the termination loads $301_0$ through $301_{M-1}$ and, a second logic state (e.g., a logic low) at tweak/ input 309 deactivates the termination loads $301_0$ through $301_{M-1}$.

Figure 4:
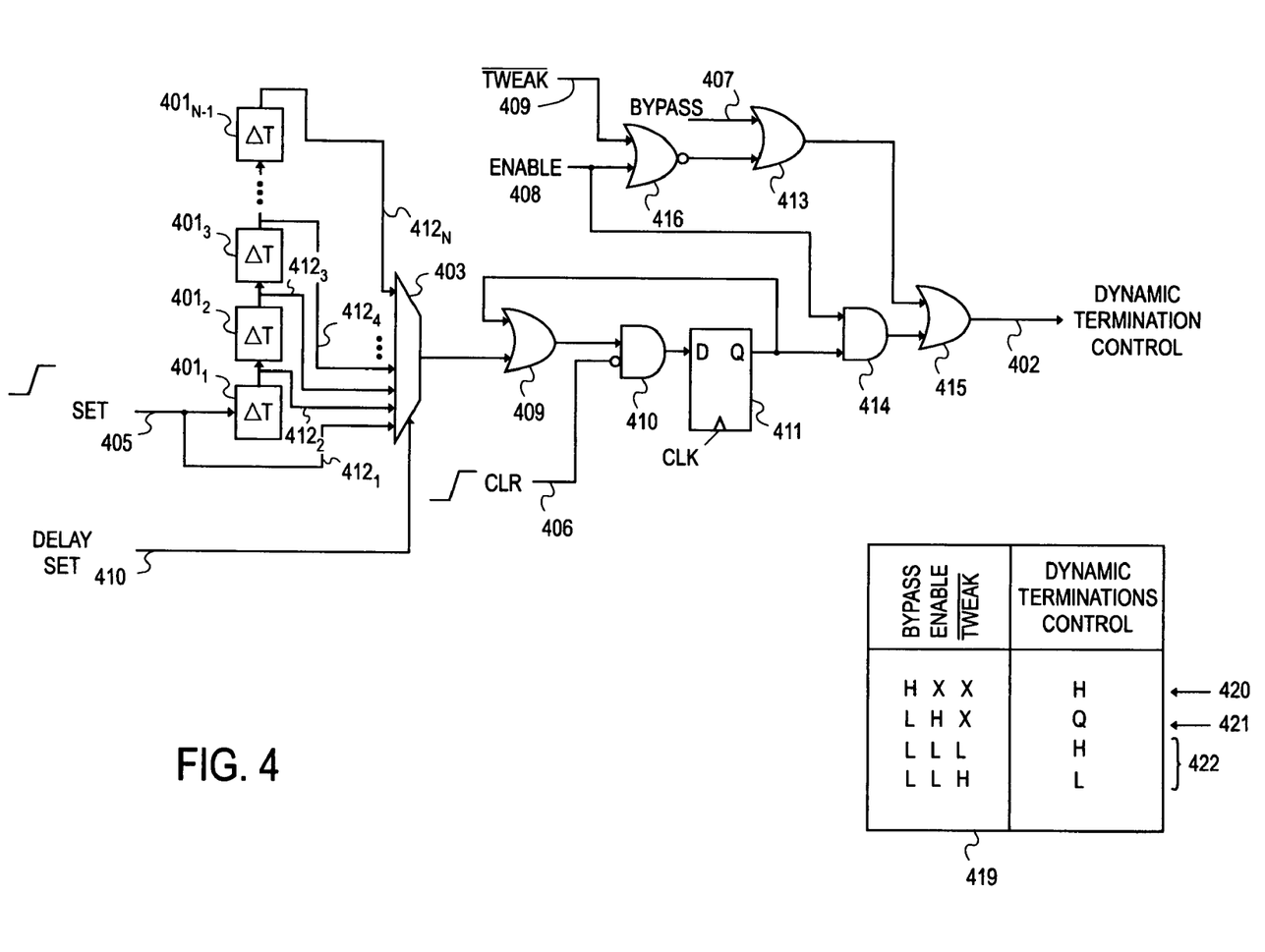
FIG. 4 shows a detailed embodiment of a design for the dynamic termination control logic circuitry observed in FIG. 3.
Figure 5:
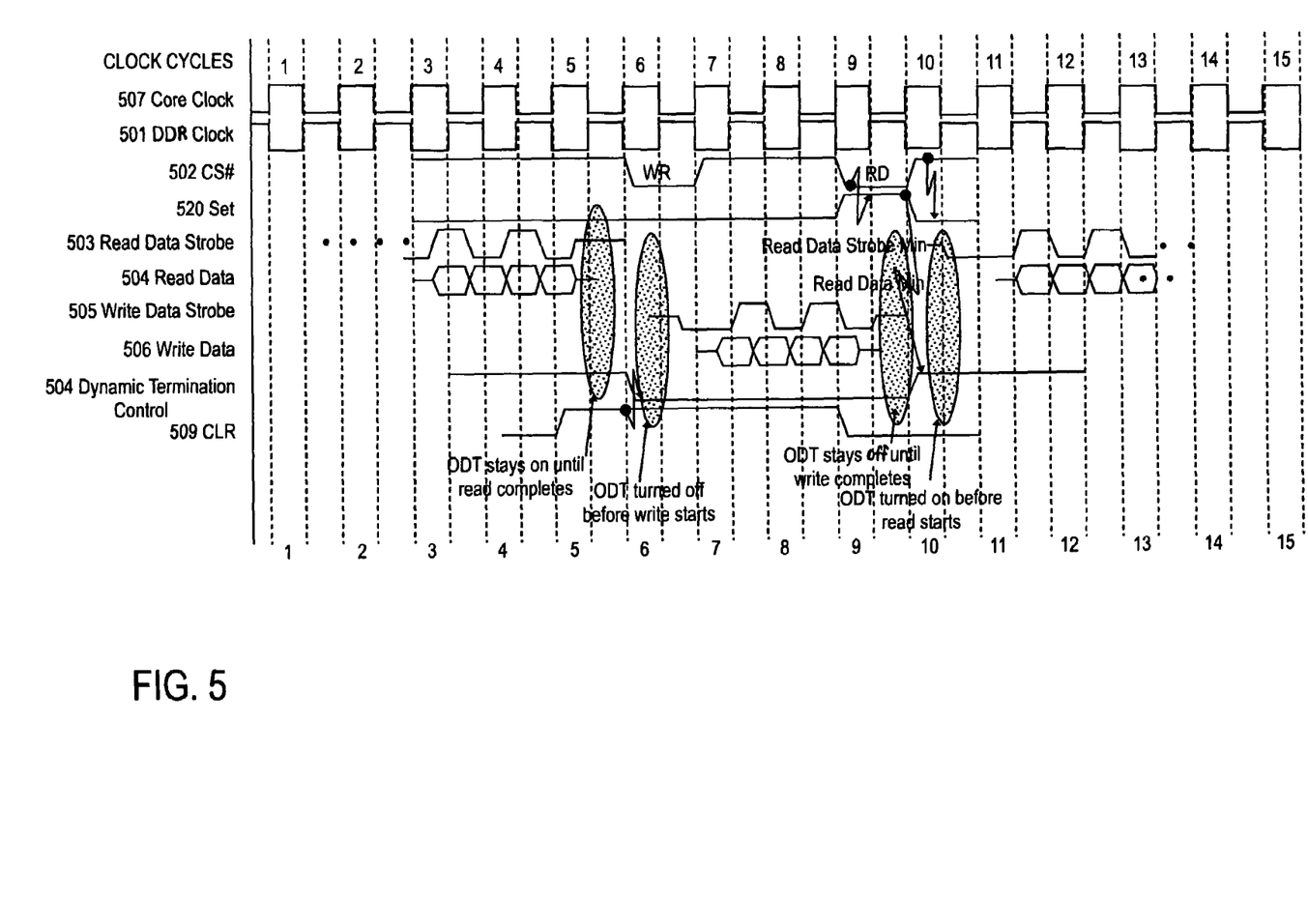
FIG. 5 shows a detailed timing signal embodiment for a memory controller that employs dynamically activated data termination.

Delay set input 310 sets a temporal delay between the moment that the set input 305 signifies that a memory read is taking place and the moment that the termination loads $301_0$ through $301_{M-1}$ are activated. More discussion concerning this temporal delay is provided further below with respect to FIGS. 4 and 5. FIG. 4 shows a detailed embodiment of a design for the dynamic termination control logic circuitry 304 observed in FIG. 3 and FIG. 5 shows an embodiment of signal timing for a memory controller that employs dynamically activated data termination.

The dynamic termination control logic circuitry embodiment of FIG. 4 may be used to drive termination loads that are set into an active state if the dynamic termination control is a logic high. As such the dynamic termination control logic circuitry embodiment of FIG. 4 is designed to raise the dynamic termination control output 402 to a logic high (to set the termination loads into an active state) in response to a rising edge presented at the set input 405 (provided inputs 407, 408, 409 are appropriately set). Exactly when the output 402 raises to a logic high, relative to the moment that a rising edge at input 405 is presented at input 405, is determined by the value presented at the set delay input 410. Allowing for a programmable temporal difference allows the memory controller to be set for a particular operating environment or range of operating environments.

Here, the set delay input 410 controls the channel select input of a multiplexer 403 where the different input channels $412_1$ through $412_N$ of the multiplexer 405 correspond to different delays imposed upon the rising edge received at input 405. A first input channel $412_1$ corresponds to no imposed delay. A chain of unit delay elements $401_1$ through $401_N$ is used to establish incremental delays for the remaining multiplexer input channels $412_2$ through $412_N$. That is, as observed in FIG. 4, the second multiplexer input channel $412_2$ corresponds to the delay imposed by a single delay element (specifically the delay imposed by delay element $401_1$); the third multiplexer input channel $412_3$ corresponds to the delay imposed by a pair of delay elements (specifically the delay imposed by delay elements $401_1$ and $401_2$); etc., and the $N^{th}$ multiplexer input channel $412_N$ corresponds to the delay imposed by all N-1 delay elements $401_1$ through $401_{N-1}$. Any circuitry which imposes a delay can be used for each delay element $401_1$ through $401_{N-1}$. For example, according to one embodiment a flip-flop is used for each delay element $401_1$ through $401_{N-1}$.

The circuitry downstream from the multiplexer output reacts to a rising edge (with proper setting of inputs 407, 408, 409), irrespective of any delay imposed to it, so as to set output 402 to a logic high; which, in turn, activates the memory controller's termination loads. Here, OR gate 409, AND gate 410 and DQ flip-flop 411 correspond to a resetable latch that: 1) to activate the termination loads, latches onto a logic high at the Q output of DQ flip flop 411 when a rising edge is presented at the multiplexer 403 output and the clear input 406 is a logic low; and, 2) to deactivate the termination loads, transitions from a latched logic high to a latched a logic low at the Q output of flip flop 411 when a rising edge is presented at the clear input 406 and the Q output of flip flop 411 is latched to a logic high. Note that the flip-flop 411 can be viewed as a type of register circuit that is capable of holding a first logical value to reflect a first state (e.g., activation of termination loads) and a second logical value to reflect a second state (e.g., deactivation of termination loads). Other embodiments may similarly use register circuitry to reflect an activation or deactivation state.

The above described modulation of the Q output of flip flop 411 essentially corresponds to the proper modulation of output 402 in response to the set and clear inputs 405, 406. That is, the Q output of flip flop 411 appears at output 402 provided inputs 407, 408 and 409 permit the resetable latch circuitry formed by logic circuitry elements 409, 410, 411 to drive output 402.

Truth table 419 demonstrates the effect inputs 407, 408, 409. Here, according to row 420 of the truth table 419, if bypass input 407 is a logic high the dynamic termination control output 402 is set to a logic high so as to set the termination loads into an active state, irrespective of the state of the other inputs 408, 409. Row 421 of truth table 419 corresponds to the input settings of inputs 407, 408, 409 that are needed to allow the above described resetable latch circuitry to drive output 402. That is, if bypass input 407 is a logic low and enable input 408 is a logic high; then, the Q output of flip flop 411 is presented at output 402 irrespective of the state of tweak/ input 409. According to rows 422 of truth table 419, if both the bypass and enable inputs 407, 408 are a logic low; then, tweak/ input 409 can be used to drive output 402. In the particular embodiment of FIG. 4, a logic low at tweak/ input 409 will result in a logic high at output 402 and a logic high at tweak/ input 409 will result in a logic low at output 402.

FIG. 5 shows a detailed timing signal embodiment for a memory controller that employs dynamically activated data termination. The timing diagram shows particular signals that may appear at a memory controller/memory interface including an interface between a DDR memory and a memory controller. The observed interface signals include: 1) a memory controller/memory DDR clock 501; 2) an active low chip select signal (CS#) that indicates whether a read or write is taking placing across the memory controller/ memory interface (and can also be used, depending on implementation, to indicate command type); 3) a read data strobe signal 503 used to strobe data out of the memory; 4) the read data 504 that is passed over the data bus; 5) a write data strobe 505 used to strobe data into the memory; and, 5) the write data 506 that is passed over the data bus. Note that, depending on implementation, the read data strobe signal 503 and write data strobe signal 505 may be passed over the same wiring between the memory controller and memory.

FIG. 5 also shows signals that, in various embodiments, are internal to the memory controller. These include: 1) the memory controller's core clock 507; 2) the dynamic termination control 508 output of the dynamic termination control circuitry that is used to control the state of the memory controller's termination loads; 3) the "set" signal 520 that causes the dynamic termination control output to activate the memory controller's termination loads; 4) the clear input 509 to the dynamic termination control logic circuitry that causes the dynamic termination control output to deactivate the memory controller's termination loads. As observed in FIG. 5 the set signal 520 is active high for read phases. The set signal 502 can be derived from the CS# signal 502.

FIG. 5 shows: 1) a first memory read phase that ends at clock cycle 5; 2) a memory write phase over the course of clock cycles 6 through 9; and, 3) a second memory read phase that begins to transmit data at clock cycle 11. Referring to the dynamic termination control output signal 508, note that the memory controller's termination loads are deactivated in clock cycle 6 (i.e., after the first memory read phase has completed) and remain deactivated over the course of the memory write phase until they are activated again at clock cycle 10 (i.e., before substantive read data appears on the data bus for the second memory read phase at clock cycle 11).

That is, temporal region 510 shows the termination loads being in an activated state during the last clock cycle (clock cycle 5) in which substantive read data appears during the first memory read phase; and, temporal region 511 shows the termination loads being deactivated in a clock cycle (clock cycle 6) that immediately follows the last clock cycle (clock cycle 5) in which substantive write data appears on the data bus for the memory write phase.

The deactivation of the termination loads in temporal region 511 is in response to a rising edge that appears in the clear input signal 509 in clock cycle 5. That is, the rising edge of clear signal 509 at clock cycle 5 causes the dynamic termination control logic circuitry (e.g., by way of the resetable latch circuit discussed above with respect to FIG. 4) to produce an output in clock cycle 6 that deactivates the memory controller's termination loads (noting that core clock 507 could be used to drive the clock input of the DQ flip flop 411 of FIG. 4).

The activation of the termination loads in temporal region 513 is in response to the rising edge that appears in the set signal 520 signal during clock cycle 9. That is, the rising edge of the set signal 502 at clock cycle 9 causes the dynamic termination control logic circuitry (e.g., by way of the resetable latch circuit discussed above with respect to FIG. 4) to produce an output in clock cycle 10 that activates the memory controller's termination loads. For the dynamic termination control logic circuitry embodiments of FIGS. 3 and 4, the temporal span between the activation of the termination loads (in response to a rising edge of signal 502 that is associated with a read phase) and the deactivation of the termination loads (in response to a rising edge in signal 509 which in turn may be in response to a read phase rising edge of signal 502) can be set through the set delay input 310, 410. In an embodiment, in order to reduce power consumption, the delay is set such that the termination loads are activated in a clock cycle immediately prior to a clock cycle in which read data first appears on the data bus for the applicable memory read cycle.

Moreover, note that in various applications the read and write strobe signals may also be bidirectional. Here, dynamically activated termination loads may also be designed for bidirectional read/write strobe wiring. For example, the output of a memory controller's dynamic termination control logic circuitry may also be coupled to termination loads that terminate the memory controller side of the read/write strobe wiring. The termination loads would be activated for read phases but not for write phases.

Figure 6:
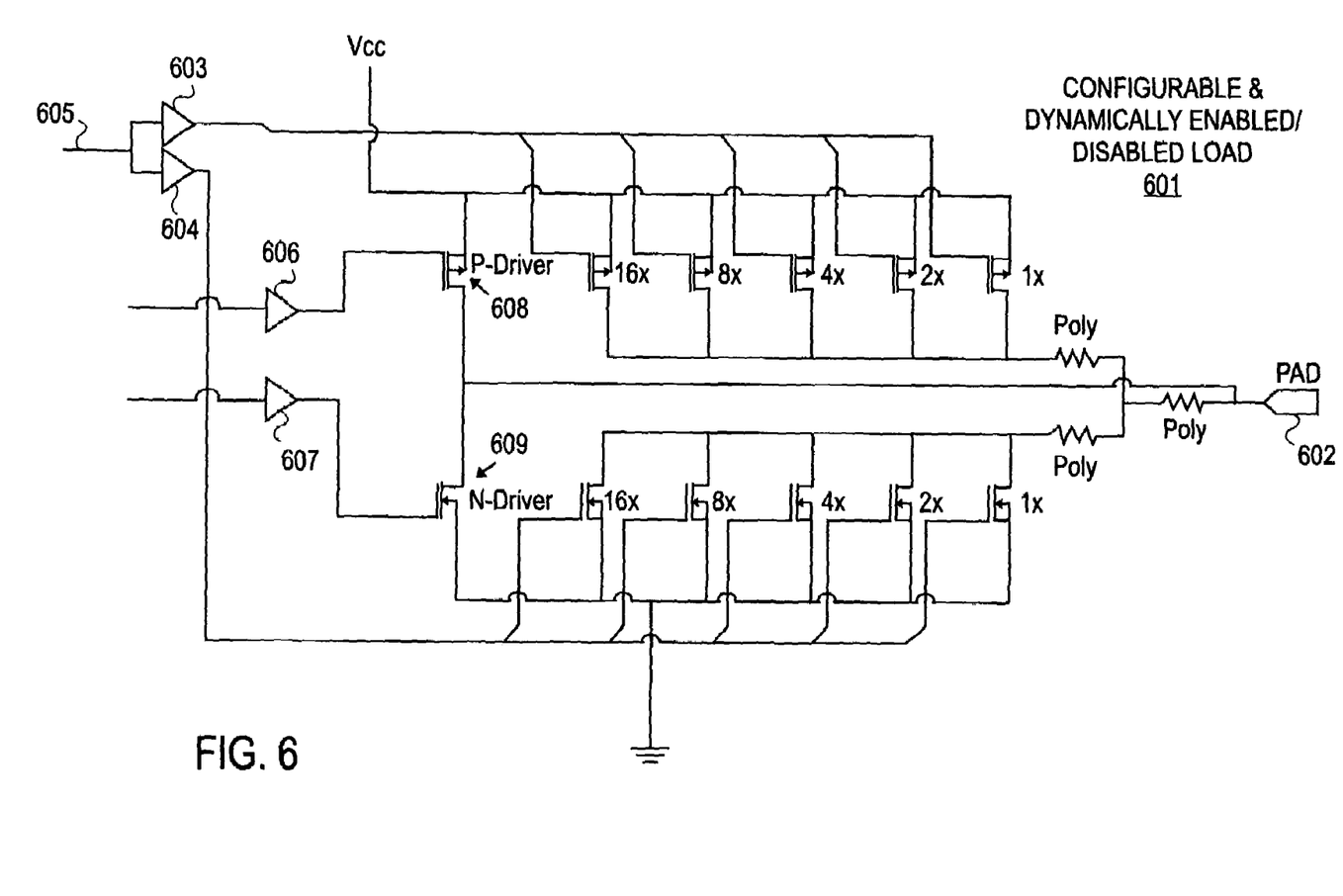
FIG. 6 shows an embodiment of a termination network that is capable of being dynamically activated.

FIG. 6 shows an embodiment of a termination load circuit that is capable of being set into activated and deactivated states. Pad 602 should be coupled to a bidirectional data bus wire or a read/write strobe wire. Input 605 controls whether the termination load is activated or deactivated (specifically, if input 605 is a logic "1" the termination load is activated; and, if input 605 is a logic "0" the termination load is deactivated) and therefore should be coupled to the output of the dynamic termination control logic circuitry. The termination load comprises legs of transistors whose sizes are "binary weighted". As transistor load capacitance is a function of transistor size, and as a load impedance is a function of transistor load capacitance, a specific load impedance value can be precisely configured by enabling one or more specific legs (where the circuitry for setting which legs are enabled is not shown for simplicity).

Drivers 603 and 604 are used to activate/deactivate upper and lower halves, respectively, of the binary weighted leg termination load. Gate 606 activates P-Driver 608 to drive a logical high "1" onto the bi-directional wire that pad 602 is coupled to (when it is appropriate for the memory controller to do so (e.g., during the write of a logical "1" but not during a read). Gate 607 activates N-Driver 609 to drive a logical low "0" onto the bi-directional wire that pad 602 is coupled to (when it is appropriate for the memory controller to do so (e.g., during the write of a logical "0" but not during a read).

Note also that embodiments of the present description may be implemented not only within a semiconductor chip but also within machine readable media. For example, the designs discussed above may be stored upon and/or embedded within machine readable media associated with a design tool used for designing semiconductor devices. Examples include a circuit description formatted in the VHSIC Hardware Description Language (VHDL) language, Verilog language or SPICE language. Some circuit description examples include: a behaviorial level description, a register transfer level (RTL) description, a gate level netlist and a transistor level netlist. Machine readable media may also include media having layout information such as a GDS-II file. Furthermore, netlist files or other machine readable media for semiconductor chip design may be used in a simulation environment to perform the methods of the teachings described above.

Thus, it is also to be understood that embodiments of this invention may be used as or to support a software program executed upon some form of processing core (such as the Central Processing Unit (CPU) of a computer) or otherwise implemented or realized upon or within a machine readable medium. A machine readable medium includes any mechanism for storing or transmitting information in a form readable by a machine (e.g., a computer). For example, a machine readable medium includes read only memory (ROM); random access memory (RAM); magnetic disk storage media; optical storage media; flash memory devices; electrical, optical, acoustical or other form of propagated signals (e.g., carrier waves, infrared signals, digital signals, etc.); etc.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed:

1. A method, comprising:
by a memory controller:
for a first read of information from a memory, activating termination loads on said memory controller's side of a data bus between said memory controller and said memory, said activating being a consequence of a first signal's indication of a first clock cycle of a plurality of consecutive clock cycles, a memory read phase being performed by said memory controller over said plurality of clock cycles, said first read of information occurring within said plurality of clock cycles;
for a write of information into said memory, deactivating said termination loads; and,
for a second read of information from said memory, activating said termination loads.

2. The method of claim 1 further comprising, by said memory controller, imposing a programmed delay to said first signal to create a second delayed signal and triggering said activating of termination loads from said second signal.

3. The method of claim 2 wherein said triggering further comprises latching a logic value from said second signal, said logic value provided to said termination loads to cause their activation.

4. The method of claim 1 further comprising triggering said activating of said termination loads by latching a logic value in response to said first signal's indication, said logic value provided to said termination loads to cause their activation.

5. The method of claim 4 further comprising latching a second logic value in response to a second signal, said second logic value provided to said termination loads to cause their deactivation for said write of information.

6. The method of claim 1 wherein said first signal is a chip select (CS) signal.

7. The method of claim 1 wherein said deactivating occurs within a clock cycle that immediately follows a last clock cycle of a plurality of clock cycles that mark a read phase within which said first read of information occurs.

8. The method of claim 1 wherein said activating occurs in response to an edge that appears in a chip select (CS) signal.

9. The method of claim 1 further comprising asserting a bypass control signal to activate said termination loads while information is being read from said memory.

10. The method of claim 1 further comprising asserting an enable control signal and not asserting a bypass control signal so as to permit said activating.

11. The method of claim 1 further comprising:
by said memory controller:
for said first read of information from a memory, activating a termination load on said memory controller's side of a data strobe wire between said memory controller and said memory;
for said write of information into said memory, deactivating said data strobe wire's said termination load; and,
for said second read of information from said memory, activating said data strobe wire's termination load.

12. An apparatus, comprising:
a memory controller comprising a data bus's termination loads, said data bus to couple to a memory, said termination loads coupled to an output of memory controller logic circuitry, said memory controller logic circuitry to drive said output to place said termination loads in an activated state during a memory read phase and to place said termination loads in a deactivated state during a memory write phase, said memory controller logic circuitry comprising a latch, said latch to latch a first value, said first value to place said termination loads in said activated state, said latch to also provide a second value, said second value to place said termination loads in said deactivated state.

13. The apparatus of claim 12 wherein said second value corresponds to a response to a clear input of said latch being activated.

14. The apparatus of claim 12 wherein said logic circuitry further comprises a logic gate between said output and a bypass input to said logic circuitry, said logic gate to place said termination loads into one of said states when said bypass input is asserted.

15. The apparatus of claim 12 wherein said logic circuitry further comprises a second logic gate between said output and a tweak input, said second logic gate to place said termination loads into said activated state based upon a first tweak input value, said second logic gate to place said termination loads into said deactivated state based upon a second tweak input value.

16. The apparatus of claim 12 wherein said logic circuitry further comprises a chain of delay elements to allow a delay to be programmed, said delay imposed between a first moment when a memory read phase is indicated and a second following moment when said termination loads are placed into said activated state.

17. The apparatus of claim 12 wherein said memory controller further comprises a data strobe wire's termination load, said data strobe wire to couple to said memory, said data strobe wire's termination load coupled to said output of said memory controller logic circuitry, said memory controller logic circuitry to drive said output to place said data strobe wire's termination load in an activated state during said memory read phase and to place said data strobe's termination load in a deactivated state during said memory write phase.

18. A method, comprising:
by a computing system:
for a first read of information from a DDR memory, activating termination loads on said memory controller's side of a data bus between said memory controller and said DDR memory, said activating being a consequence of a first signal's indication of a first clock cycle of a Plurality of consecutive clock cycles, a DDR memory read phase being performed by said memory controller over said plurality of clock cycles, said first read of information occurring within said Plurality of clock cycles;
for a write of information into said DDR memory, deactivating said termination loads; and,
for a second read of information from said DDR memory, activating said termination loads.

19. The method of claim 18 further comprising, by said memory controller, imposing a programmed delay to said first signal to create a second delayed signal and triggering said activating of termination loads from said second signal.

20. The method of claim 19 wherein said triggering further comprises latching a logic value from said second signal, said logic value provided to said termination loads to cause their activation.

21. The method of claim 18 further comprising triggering said activating of said termination loads by latching a logic value in response to said first signal's indication, said logic value provided to said termination loads to cause their activation.

22. The method of claim 21 further comprising latching a second logic value in response to a second signal, said second logic value provided to said termination loads to cause their deactivation for said write of information.

23. The method of claim 18 wherein said first signal is a chip select (CS) signal.

24. The method of claim 18 wherein said deactivating occurs within a clock cycle that immediately follows a last clock cycle of a plurality of clock cycles that mark a read phase within which said first read of information occurs.

25. The method of claim 18 wherein said activating occurs in response to an edge that appears in a chip select (CS) signal.

26. The method of claim 18 further comprising asserting a bypass control signal to activate said termination loads while information is being read from said DDR memory.

27. The method of claim 18 further comprising asserting an enable control signal and not asserting a bypass control signal so as to permit said activating.

28. The method of claim 18 further comprising:
by said memory controller:
for said first read of information from a DDR memory, activating a termination load on said memory controller's side of a data strobe wire between said memory controller and said DDR memory;
for said write of information into said DDR memory, deactivating said data strobe wire's termination load; and,
for said second read of information from said DDR memory, activating said data strobe wire's termination load.

29. An apparatus, comprising:
a computing system comprising:
a memory controller comprising a data bus's termination loads, said data bus coupled to a DDR memory, said termination loads coupled to an output of memory controller logic circuitry, said memory controller logic circuitry to drive said output to place said termination loads in an activated state during a read phase of said DDR memory and to place said termination loads in a deactivated state during a write phase of said DDR memory, said memory controller logic circuitry comprising a latch, said latch to latch a first value, said first value to place said termination loads in said activated state, said latch to also provide a second value, said second value to place said termination loads in said deactivated state.

30. The apparatus of claim 29 wherein said second value corresponds to a response to a clear input of said latch being activated.

31. The apparatus of claim 29 wherein said logic circuitry further comprises a logic gate between said output and a bypass input to said logic circuitry, said logic gate to place said termination loads into one of said states when said bypass input is asserted.

32. The apparatus of claim 29 wherein said logic circuitry further comprises a second logic gate between said output and a tweak input, said second logic gate to place said termination loads into said activated state based upon a first tweak input value, said second logic gate to place said termination loads into said deactivated state based upon a second tweak input value.

33. The apparatus of claim 29 wherein said logic circuitry further comprises a chain of delay elements to allow a delay to be programmed, said delay imposed between a first moment when a read phase of said DDR memory is indicated and a second following moment when said termination loads are placed into said activated state.

34. The apparatus of claim 12 wherein said memory controller further comprises a data strobe wire's termination load, said data strobe wire to couple to said DDR memory, said data strobe wire's termination load coupled to said output of said memory controller logic circuitry, said memory controller logic circuitry to drive said output to place said data strobe wire's termination load in an activated state during said DDR memory read phase and to place said data strobe's termination load in a deactivated state during said DDR memory write phase.

35. A machine readable medium having stored thereon a description of a design for a memory controller, the memory controller comprising:
a data bus's termination loads, said data bus to couple to a memory, said termination loads coupled to an output of memory controller logic circuitry, said memory controller logic circuitry to drive said output to place said termination loads in an activated state during a memory read phase and to place said termination loads in a deactivated state during a memory write phase, said memory controller logic circuitry comprising a latch, said latch to latch a first value, said first value to place said termination loads in said activated state, said latch to also provide a second value, said second value to place said termination loads in said deactivated state.

36. The machine readable medium of claim 35 wherein said second value corresponds to a response to a clear input of said latch being activated.

37. The machine readable medium of claim 35 wherein said logic circuitry further comprises a logic gate between said output and a bypass input to said logic circuitry, said logic gate to place said termination loads into one of said states when said bypass input is asserted.

38. The machine readable medium of claim 35 wherein said logic circuitry further comprises a second logic gate between said output and a tweak input, said second logic gate to place said termination loads into said activated state based upon a first tweak input value, said second logic gate to place said termination loads into said deactivated state based upon a second tweak input value.

39. The machine readable medium of claim 35 wherein said logic circuitry further comprises a chain of delay elements to allow a delay to be programmed, said delay imposed between a first moment when a memory read phase is indicated and a second following moment when said termination loads are placed into said activated state.

* * * * *